United States Patent
Higashi et al.

(10) Patent No.: US 6,541,861 B2
(45) Date of Patent: Apr. 1, 2003

(54) SEMICONDUCTOR DEVICE MANUFACTURING METHOD INCLUDING FORMING STEP OF SOI STRUCTURE AND SEMICONDUCTOR DEVICE HAVING SOI STRUCTURE

(75) Inventors: Kazuyuki Higashi, Yokohama (JP); Tamao Takase, Yokohama (JP); Hideki Shibata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/893,454

(22) Filed: Jun. 29, 2001

(65) Prior Publication Data

US 2002/0011670 A1 Jan. 31, 2002

(30) Foreign Application Priority Data

Jun. 30, 2000 (JP) .......................... 2000-199628
Sep. 27, 2000 (JP) .......................... 2000-293926

(51) Int. Cl.⁷ .............................................. H01L 23/48
(52) U.S. Cl. .................. 257/751; 257/347; 257/507; 257/506; 257/510; 257/751; 257/767
(58) Field of Search ................................ 257/347, 349, 257/354, 507, 510, 751, 767; 438/627, 643, 927

(56) References Cited

U.S. PATENT DOCUMENTS

| | | | | |
|---|---|---|---|---|
| 5,650,639 A | * | 7/1997 | Schrantz et al. | 257/347 |
| 5,893,752 A | * | 4/1999 | Zhang et al. | 438/627 |
| 6,150,723 A | * | 11/2000 | Harper et al. | 257/751 |
| 6,181,012 B1 | * | 1/2001 | Edelstein et al. | 257/751 |
| 6,211,073 B1 | * | 4/2001 | Ahn et al. | 438/627 |
| 6,214,660 B1 | * | 4/2001 | Uemoto et al. | 438/240 |
| 6,271,591 B1 | * | 8/2001 | Dubin et al. | 257/751 |
| 6,281,095 B1 | * | 8/2001 | Bolam et al. | 438/151 |
| 6,351,036 B1 | * | 2/2002 | Stumborg et al. | 257/751 |
| 2001/0023127 A1 | * | 9/2001 | Andreas | 438/623 |
| 2001/0050435 A1 | * | 12/2001 | Li | 257/751 |

FOREIGN PATENT DOCUMENTS

JP 10-32321 2/1998

OTHER PUBLICATIONS

Matsumoto et al.; "Semiconductor Wafer, Method of Manufacturing the Same and Semiconductor Device", U.S. patent application Ser. No. 09/395,204, filed on Sep. 14, 1999.
Shimooka et al.; "Semiconductor Device", U.S. patent application Ser. No. 09/531,536, filed on Mar. 20, 2000.

* cited by examiner

Primary Examiner—Nathan J. Flynn
Assistant Examiner—Pershelle Greene
(74) Attorney, Agent, or Firm—Finnegan, Henderson, Farabow, Garrett & Dunner, L.L.P.

(57) ABSTRACT

A semiconductor manufacturing method has the steps of preparing an SOI substrate having a supporting substrate, an insulating film formed above the supporting substrate, a semiconductor region formed above the insulating film, and an intermediate layer formed between the supporting substrate and the insulating film, forming a semiconductor element in the semiconductor region, and removing the intermediate layer to separate the supporting substrate and the semiconductor region in which the semiconductor element is formed.

4 Claims, 6 Drawing Sheets

SEMICONDUCTOR DEVICE MANUFACTURING METHOD INCLUDING FORMING STEP OF SOI STRUCTURE AND SEMICONDUCTOR DEVICE HAVING SOI STRUCTURE

CROSS-REFERENCE TO RELATED APPLICATIONS

This application is based upon and claims the benefit of priority from the prior Japanese Patent Applications No. 2000-199628, filed Jun. 30, 2000; and No. 2000-293926, filed Sep. 27, 2000, the entire contents of both of which are incorporated herein by reference.

BACKGROUND OF THE INVENTION

1. Field of the Invention

The present invention relates to a manufacturing method of a semiconductor device and a semiconductor device, and more particularly, to a manufacturing method of a semiconductor device and the semiconductor device with an improved SOI structure.

2. Description of the Related Art

In recent years, large-scaled integrated circuits (chip) wherein a number of elements such as transistors and resistors are connected to constitute an electric circuit, and are integrated on a semiconductor substrate, have frequently been employed in the main portions of a computer or a communicating device. The performance of the device thus depends on the performance of each of the semiconductor devices.

There is also recently proposed a so-called multi-chip semiconductor device using a plurality of chips to improve the performance of the semiconductor device. Some of the multi-chip semiconductor devices are formed to have a plurality of stacked thin chips by employing chip-on-chip technology.

The thin chips are formed with use of the technology called "back grinding". This is a method wherein the rear side face of the wafer is ground with a grinding device after the wafer manufacturing process has finished, to decrease thickness of the wafer.

The thin-chip forming method using the back grinding technique, however, has following problems. That is, it is difficult to make the wafer very thin with the back grinding technique, and thus it takes a long time to attain the very thin wafer. In addition, the grinding process on the rear side face of the wafer physically damages the wafer.

Incidentally, the SOI (Silicon On Insulator) substrate is introduced into the devices used for commercial products to reduce the parasitic capacitance and improve the response of the semiconductor device. On the other hand, multi-layer wiring is employed in semiconductor devices, because the integration density of the devices keeps increasing and the size of their elements keep decreasing. In addition, Cu wires are now used in place of Al wires, because they have lower resistance and higher melting point than Al wires. In view of this, it is expected that the SOI substrate and the Cu wires will be used in combination in order to enhance the integration density and operating efficiency of semiconductor devices.

The Cu wiring has an excellent advantage that the Cu wiring has small RC delay due to the property of the material of the wiring itself and it cannot be easily cut even in the case that the current density is so high (in other words, the Cu wiring has high durability against the electromigration). Cu, however, has large diffusion coefficient in silicon. Therefore, if the device is subjected to the process with a heat treatment step after the Cu wiring is formed therein, Cu of the Cu wiring is diffused into an interlayer insulating film formed of material belonging to a $SiO_2$ group. The diffusion of Cu into the interlayer insulating film will cause some problems such as the increase of the leak current from the interlayer insulating film and the increase of the dielectric constant. If Cu is diffused into a gate insulation film, the level of the threshold voltage will fluctuate. Cu diffusion will be also caused by a high electric field applied to the Cu.

In order to solve the above-mentioned problems, the side and the bottom surfaces of the Cu wiring are covered with a film called as a barrier metal film made of a metal compound such as TaN that will prevent the diffusion of Cu, and the top surface of the Cu wiring is covered with a so-called top barrier film, i.e., an insulating film such as a silicon nitride film.

The diffusion of Cu into the interlayer insulating film can be prevented in the above-mentioned manner. However, the manner remains a problem in terms of the Cu diffusion.

During the forming process of the Cu wiring, an amount of Cu will adhere to a rear side surface of the silicon substrate. The adhered Cu diffuses into the silicon substrate. If the Cu diffused into the substrate enters into an element region, the deterioration or fluctuation of the characteristics or performance of the elements will occur thereby.

BRIEF SUMMARY OF THE INVENTION

The present invention is intended to provide a semiconductor device manufacturing method which enables shortening the period of time required for preparing a thin substrate (wafer), and to suppressing damage to the thin substrate while preparing the substrate.

The first aspect of the present invention includes a step of preparing an SOI substrate having a supporting substrate, an insulating film formed above the supporting substrate, a semiconductor region formed above the insulating film, and an intermediate layer formed between the supporting substrate and the insulating film, a step of forming a semiconductor element in the semiconductor region, and a step of removing the intermediate layer to separate the supporting substrate and the semiconductor region in which the semiconductor element is formed.

Another object of the present invention is to provide a semiconductor device manufacturing method which is able to prevent metal composing a metal wiring from diffusing from the rear side surface of the semiconductor substrate.

The second aspect of the present invention includes a semiconductor region having a semiconductor element, and a diffusion barrier layer provided in the semiconductor region and shaped like a bowl.

The third aspect of the present invention includes a supporting substrate, an insulating film provided on the supporting substrate, a semiconductor region provided on the insulating film, the semiconductor region having a semiconductor element formed therein, and a diffusion barrier layer a part of which is provided in the semiconductor region, a part of which is provided in the insulating film, a bottom of which is placed in the supporting substrate and shaped like a bowl.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

The present invention can be more fully understood from the following detailed description of an embodiment of the invention in conjunction with the accompanying drawings.

(The First Embodiment)

FIGS. 1A–1E are sectional views showing a manufacturing process of the semiconductor device according to the first embodiment of the present invention.

Figure 1A:
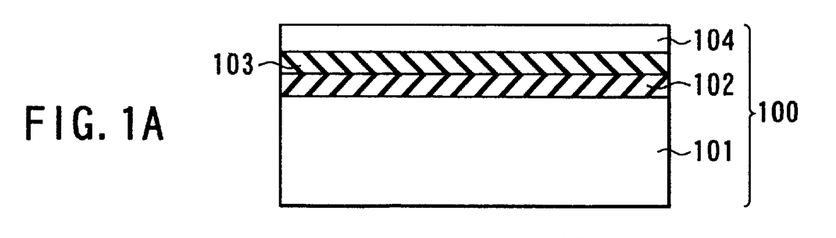
FIGS. 1A–1E are sectional views showing a manufacturing process of the semiconductor device according to the first embodiment of the present invention.

First of all, as shown in FIG. 1A, form an SOI substrate 100, which is composed of a silicon nitride film (first insulating film) 102, a silicon oxide film (second insulating film) 103 and a Si semiconductor region 104, which are formed one upon another in the order mentioned. Note that the silicon nitride film 102 serves as an intermediate layer.

If the SOI substrate is a bonding substrate, the SOI substrate forming process is performed in the following manner, for instance. At first, the silicon nitride film is formed on the Si supporting substrate 101 with such a technique as thermal nitridation, CVD, or sputtering.

The above-mentioned step is followed by the plasma processing on the surface of the silicon nitride film 102 or the forming of a thin silicon oxide film (not shown) on the silicon nitride film 102.

Next, the silicon oxide film 103 is deposited on a silicon substrate which is to be the Si semiconductor region 104 with use of CVD or sputtering technique.

Next, the silicon substrate which is to be the Si semiconductor region 104 and the Si supporting substrate 101 are bonded to each other such that a surface of silicon nitride film 102 and a surface of the silicon oxide film 103 are to be boding surfaces.

The Si semiconductor region 104 is formed by polishing the silicon substrate to complete the SOI substrate (boding substrate).

In this embodiment, a silicon nitride film is employed as the first insulating film, and a silicon oxide film is employed as the second insulating film. The first insulating films may be formed of a silicon oxide film, and the second insulating films may be formed of a silicon nitride film.

Also in the latter case, the SOI substrate 100 (bonding substrate) 100 can be formed in the above-mentioned manner. For example, a silicon oxide film is formed on the Si supporting substrate 101 with use of the thermal oxidation technique, at first. The silicon nitride film is then formed with the CVD technique. Subsequently, the plasma processing is performed on the surface of the silicon nitride film, or a thin silicon oxide film (not shown) is formed on the silicon nitride film. Next, a silicon substrate, which will be the Si semiconductor region 104, is bonded on the silicon nitride film. This process is followed by the polishing step of the silicon substrate to form the Si semiconductor region 104. In this manner, the completed SOI substrate 100 (bonding substrate) is obtained. The second insulating film may be formed of an $Al_2O_3$ film.

Figure 1B:
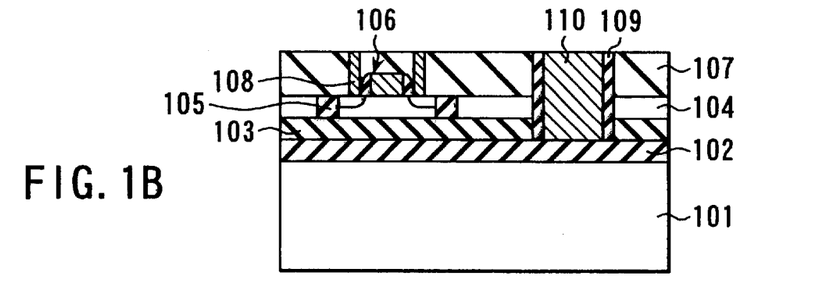

As shown in FIG. 1B, after the forming step of an insulating dielectrics film 105 with use of the STI technique and an element 106 such as a MIS transistor on the Si semiconductor region 104, the first interlayer insulating film 107 for protecting the element 106 is formed.

The process is followed by the forming step of a plug 108 for connecting the element 106 in the first interlayer 107. Then, after a resist pattern (not shown) having a window in a region in which the through plug is to be formed, the first interlayer insulating film 107, a Si semiconductor region 104, the silicon oxide film 103 are etched by using the resist pattern as a mask so as to form a through hole. The resist pattern is removed after the formation of the through hole, and a plasma CVD is performed to form an insulating film such as a silicon oxide film. The insulating film thus formed is etched, leaving a part of on all surfaces of the through hole, except the bottom thereof. A through plug 110 is then formed of a metal material so as to be embeded in the hole.

Figure 1C:
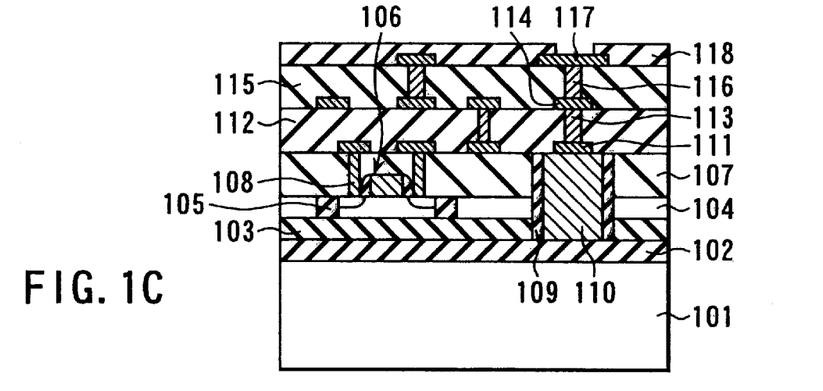

Next, after a formation of a wiring 111 for connecting the plug 108 or the through plug 110 on the interlayer insulating film 107, the second interlayer insulating film 112 is formed, as shown in FIG. 1C. Thereafter, a plug 113 for connecting the wiring 111 is formed in the second interlayer insulating film 112. Subsequently, a wiring 114, a third interlayer insulating film 115, and a plug 116 are formed on the second interlayer insulating film 112. In addition, a pad 117 and a passivation layer 118 formed of polyimide are formed thereafter. Pad contact hole for the pad 117 is opened in the passivation layer 118. The wafer process is completed in this manner.

Figure 1D:
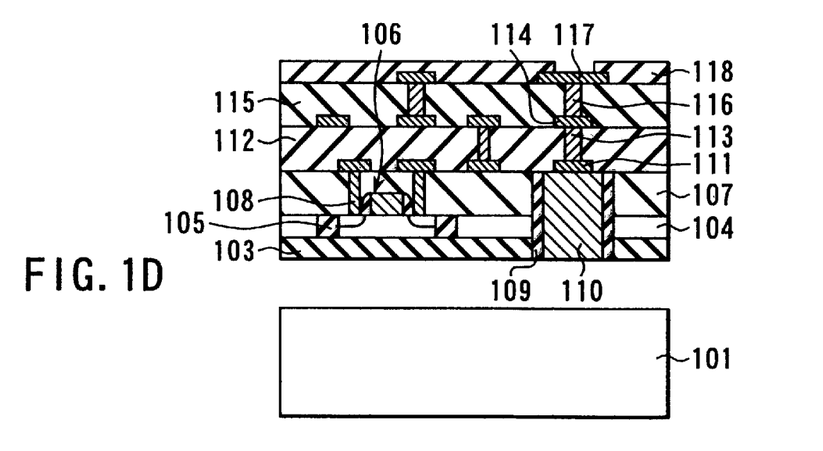

Subsequently, as shown in FIG. 1D, the silicon nitride film 102 is selectively resolved with the wet etching using a solution such as the solution of hot phosphoric acid to separate the Si semiconductor region 104 on which the element is formed and the Si supporting substrate 101. As a result, a remarkably thin silicon substrate having layers 103–118 (silicon element substrate) and having a thickness of several ten μm, wherein the element is formed and the through plug 110 is exposed. According to the conventional technique using the back grinding, the silicon element substrate has a thickness as large as 500 μm, approximately. The separation step can be performed on either of the silicon wafer and diced chips.

In the process, the Si semiconductor region 104 that is very thin and contains elements can be obtained without performing a polishing process, but a chemical process such as wet etching or chemical downflow etching is employed. Generally, with use of the etching technique, the object to be processed can be removed at higher rate than that of the grinding technique, and less mechanical damage will be applied to the object in comparing the grinding technique. Therefore, the present embodiment can reduce the processing time compared with the conventional method employing the grinding technique on the rear side surface. In addition, the method of the present embodiment does not apply any mechanical damage to the extremely thin Si semiconductor region 104.

Figure 1E:
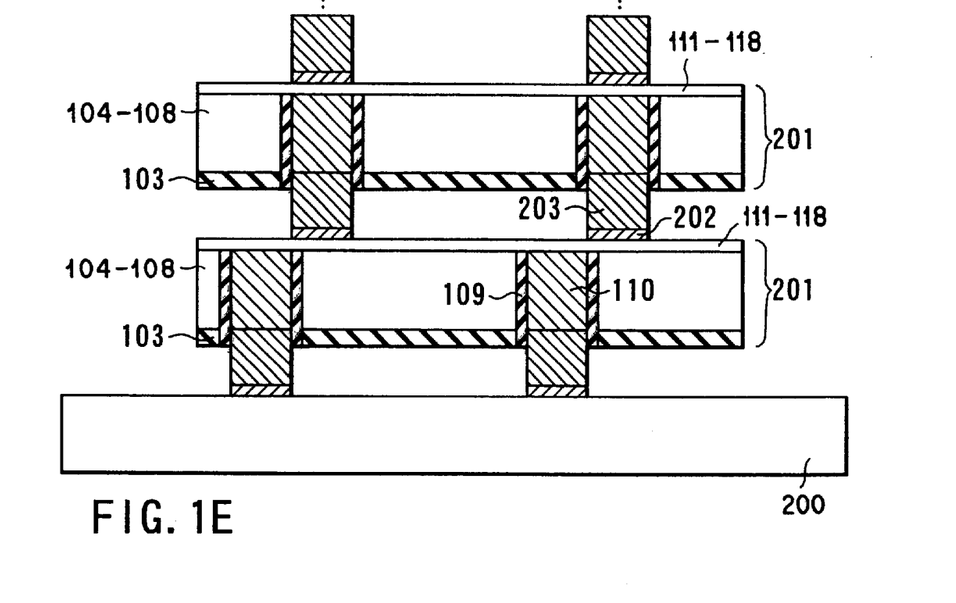

The process is subsequently performed in such a manner that a plurality of chips 201 obtained by dicing the wafer are vertically connected to each other, to obtain a chip-on-chip, as shown in FIG. 1E. Reference number 200 denotes assembly substrate. The connection of the chips is performed by connecting the through plug 110 of a chip 201 with another chip 201 via a barrier metal 202 and soldering 203. The chips shown in FIG. 1E have circuits on the upper surfaces.

Two chips 201 are laid one upon the other, forming a two-layer structure as is shown FIG. 1E. In practice, however, a through plug 110 is formed on the upper chip 201 and a chip (not shown) of a third layer is connected to the through plug 110. No through plugs are formed on a chip of a top layer.

In this embodiment, a bonding wafer is employed. Instead, a SIMOX wafer may be used. If a SIMOX wafer is used, oxygen ions and nitrogen ions are implanted into the silicon substrate by ion implantation at such an acceleration voltage that one of the oxygen-concentration peak and the nitrogen-concentration peak may be observed at a position nearer the surface of the substrate than the other of the oxygen-concentration peak and the nitrogen-concentration peak. The ion-implanted substrate is then subjected to the heat treatment with high temperature, thereby the SIMOX wafer wherein a silicon nitride film and a silicon oxide film are formed in the silicon substrate is obtained.

As described above, according to the present embodiment, two kinds of insulating films, i.e., the silicon nitride film and the silicon oxide film are employed as insulating films in the SOI substrate, and the insulating film on the side of the supporting substrate is selectively removed by etching after the element is formed in the Si semiconductor region. In this manner, a remarkably thin silicon chip can be formed in a short period of time and with less damage.

The first and second insulating films are not limited to those films described above. The table presented below represents the combinations of the first and second insulating films and the selective removing methods(wet etching, chemical downflow etching) of the first insulating film. Further, if an amorphous silicon (α-Si) film is employed as the intermediate layer, instead of the first insulating film, it is preferable to use a Cl containing etching source for chemical downflow etching by which the etching rate of the α-Si is set higher than that of single crystal silicon (Si substrate).

| first film | second film | etching solution | etching gas |
|---|---|---|---|
| SiO$_2$ | SiN<br>SiC<br>AlN<br>Al$_2$O$_3$ | fluoric acid or fluorine ammonium | CF$_4$/O$_2$ |

-continued

| first film | second film | etching solution | etching gas |
|---|---|---|---|
| SiN<br>SiC<br>Al$_2$O$_3$ | SiO$_2$ | hot phosphoric acid | |
| α-Si | SiO$_2$ | | Cl containing gas |

When the first or second insulating film is formed of the same material used for forming the diffusion barrier layer that will be described in the second embodiment, the diffusion of metal such as Cu from the rear side surface of the Si supporting substrate 101 into the Si semiconductor region 104 can be prevented.

(The Second Embodiment)

FIGS. 2A–2F are sectional views showing a manufacturing process of the semiconductor device according to the second embodiment of the present invention. In the present embodiment, material enable to prevent the diffusion of metal such as Cu is used as material of the insulating film in the SOI substrate, thereby metal contamination of the substrate by the metal diffused from the rear side surface or the side surface of the substrate is intended to be prevented.

Figure 2A:
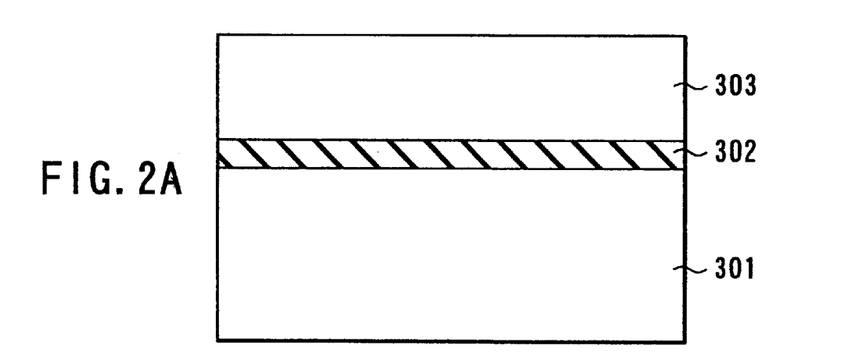
FIGS. 2A–2F are sectional views showing a manufacturing process of the semiconductor device according to the second embodiment of the present invention.

FIG. 2A shows an SOI substrate, and 301 and 303 denote single crystal silicon substrates, and 302 denotes a silicon oxide film. The SOI substrate can be formed by several methods. The following is a description of the bonding method. At first, a silicon oxide film 302 is formed on a surface of the silicon substrate 301 by thermal oxidation. On the other hand, another silicon substrate 303 with a mirror-polished surface is prepared to be bonded with the silicon substrate 301 in a vacuum atmosphere so as to hold the silicon oxide film 302 therebetween. The silicon substrate 303 is then polished to a necessary thickness, thereby the SOI substrate shown in FIG. 2A can be obtained.

Figure 2B:
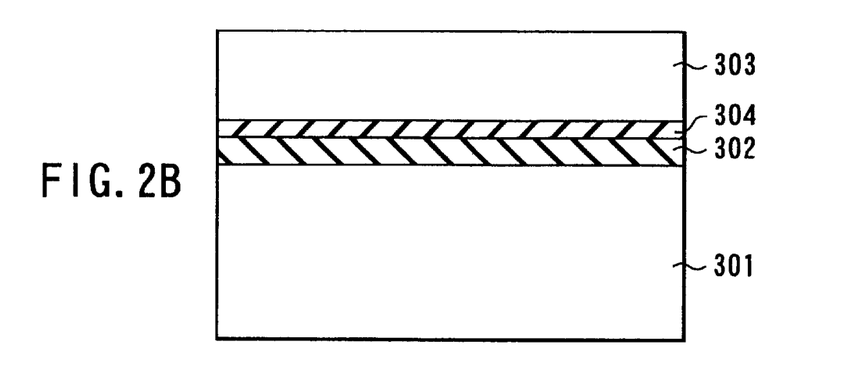

Next, as shown in FIG. 2B, the silicon substrate 303 is doped with nitrogen ions, then subjected to annealing to form a diffusion barrier layer 304 in the silicon substrate 303. At this time, a predetermined amount of nitrogen atoms, which is stoichiometrically enough to make the diffusion barrier layer become a silicon nitride film, is implanted into the silicon substrate 303. The diffusion barrier layer 304 is formed on the silicon oxide film 302 to contact thereto. In the nitrogen ion implantation process, the accelerating voltage is controlled such that the concentration of nitrogen is the highest in the silicon substrate 303 above the silicon oxide film 302. The nitrogen ions may be introduced into the silicon oxide film 302.

Instead of the above-mentioned method, another method may be employed, wherein nitrogen ions are implanted so that the concentration of nitrogen is the highest in the upper portion of the silicon oxide 302 to turn the upper portion of the silicon oxide film 302 into the silicon nitride layer 304.

Figure 2C:
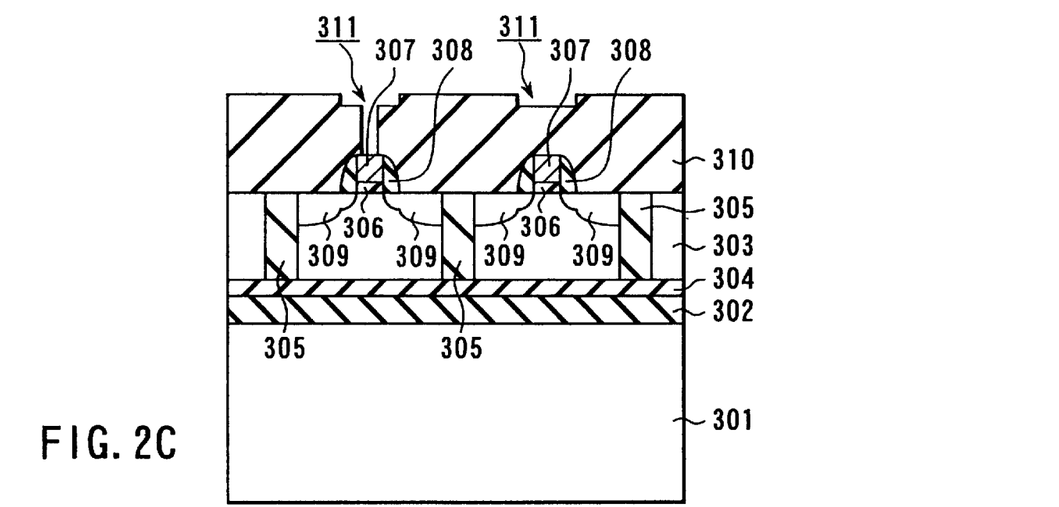

In the next step shown in FIG. 2C, isolation trenches which reach the silicon nitride layer 304 are formed on the surface of silicon substrate 303 and filled with isolation dielectrics film 305 to isolate the elements from each other. Subsequently, active elements such as MOS transistors are formed in the regions each defined by the isolation dielectrics film 305. In the drawing, 306 denotes gate insulating films, 307 denotes gate electrodes, 308 denotes gate side wall insulating films (spacers), and 309 denotes source/drain regions each having extension. After forming the elements, an interlayer insulating film 310 is deposited on the entire surface thereof, and contact holes and wiring trenches 311 are formed therein.

Figure 2D:
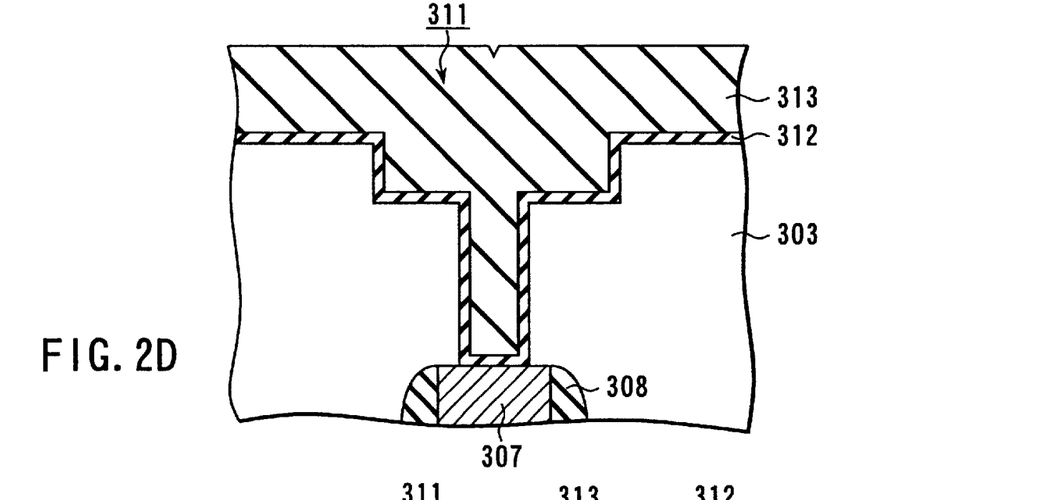

Next, as shown in FIG. 2D, a barrier metal film 312 is formed to entirely cover the inner side surface of the contact holes and wiring trenches 311. The contact holes and wiring trenches 311 are filled with a Cu film 313 entirely formed on the barrier metal film 312 with the plating, for example. The barrier metal film 312 is preferably formed of nitride such as TaN, WN, VN, NbN, CrN, or MoN.

Figure 2E:
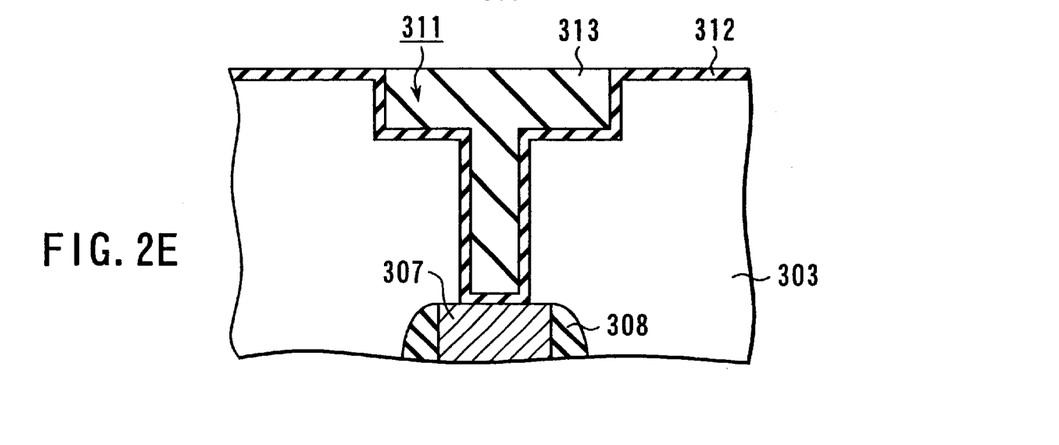

In the subsequent step shown in FIG. 2E, the Cu film 313 and the barrier metal film 312 placed out of the contact holes and wiring trenches 311 are removed with use of the CMP in order to form a Cu dual damascene (Cu-DD) wiring. Subsequently, an insulating film (not shown) as a top barrier film is formed thereon. In order to prevent dishing, the CMP process is preferably so-called two-step polishing process wherein the Cu film 313 and the barrier metal film 312 are separately removed by the CMPs in different conditions.

Figure 2F:
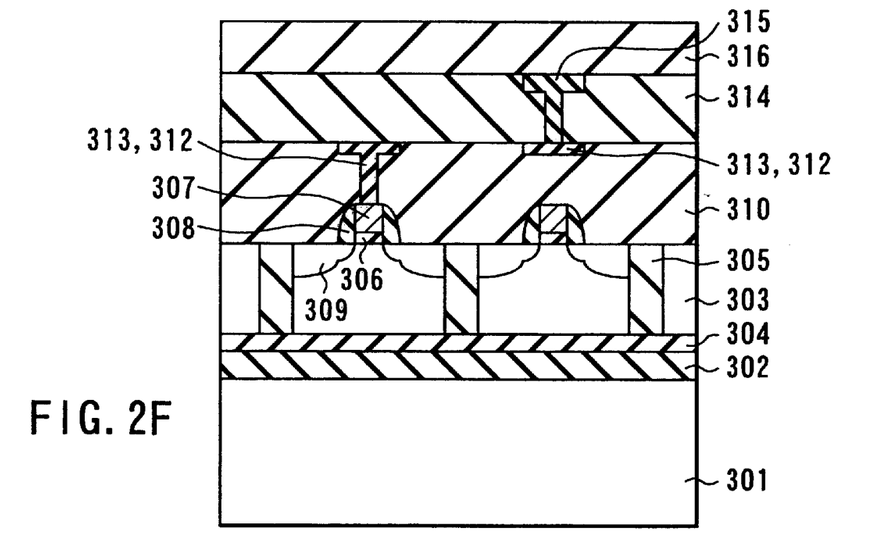

Next, as shown in FIG. 2F, after an interlayer insulating film 314 are deposited on the entire surface of the top barrier film, an upper Cu-DD wiring (a Cu wiring and a barrier metal film) 315 is formed in accordance with the method described above in conjunction with FIGS. 2D and 2E. This embodiment presents a double layer wiring, as described above. This embodiment uses double layer wiring, as described above. The double layer wiring may be replaced by one composed of three or more layers. In this case, all the wiring layers are not necessary to be Cu wirings, but some of the wiring layers may be formed as Al wirings. After the forming of the upper Cu-DD wiring, a passivation film is deposited to cover the entire surface of the upper Cu-DD wiring.

Even if Cu is adhered to the rear surface of the silicon substrate 301 and diffused into the silicon substrate 301 in the forming step of the upper Cu-DD wiring, the diffusion will be stopped at a position of the diffusion barrier layer 304, and thus the deterioration or the fluctuation of the characteristics or performance of the elements due to the Cu contamination will be prevented. According to this embodiment, the Cu diffusion in the interlayer insulating film 303 and 314 will be prevented by the barrier metal film 312 and the top barrier film (not shown), as in the conventional device. Further, the prevention of contamination due to metal other than the Cu-DD wiring, which is used in the manufacturing process of the device, may be also expected according to the present embodiment.

Subsequently, before or after performing a step of dicing a wafer into a plurality of chips to be separated from each other, i.e., a dicing process, not shown in the drawings is performed, in which the silicon oxide film 302 is removed by the etching in the same manner as shown in the first embodiment, thereby a remarkably thin silicon element substrate can be obtained.

The SOI substrate of the present embodiment is formed by the wafer bonding process, but may be formed with the SIMOX process. In the case employing the SIMOX process, the ion-implantation steps of highl energy oxygen ions and nitrogen ions are serially performed at first, and the heat treatment with high temperature will be then performed to form the silicon oxide film 302 and the diffusion barrier layer 304. The steps shown in FIGS. 2C–2F are subsequently performed thereafter.

Figure 3:
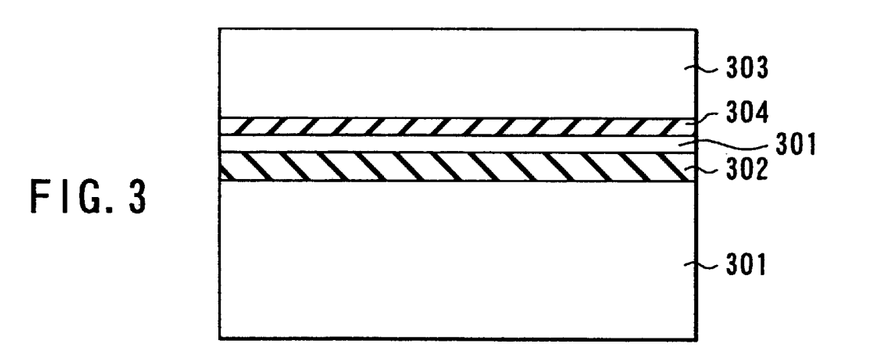
FIG. 3 is a sectional view showing a modification of the second embodiment.

Further, in this embodiment, the silicon oxide film 302 and the diffusion barrier layer 304 are formed to contact each other, but may be formed as totally different layers as shown in FIG. 3. In this case, the silicon oxide film 302 can be free from nitrogen.

Figure 4:
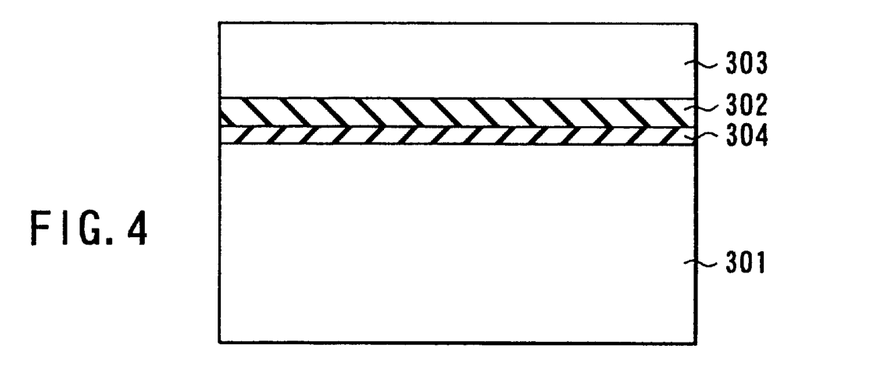
FIG. 4 is a sectional view showing another modification of the second embodiment.

Further, the silicon oxide film 302 and the diffusion barrier layer 304 can be set upside-down, more specifically, The silicon oxide film 302 and the diffusion barrier layer 304 may be switched in position as shown in FIG. 4. More specifically, the film 302 may be provided on the layer 304. In this case, a thin silicon element substrate obtained by removing the diffusion barrier layer 304 as an intermediate layer has no diffusion barrier layer. The substrate, however, can be prevented from being contaminated by metal diffused from the rear side surface thereof at least before finishing the wafer process. The silicon oxide film 302 and the diffusion barrier layer 304 can be formed as a mixed layer, for example a SiON film.

Figure 5:
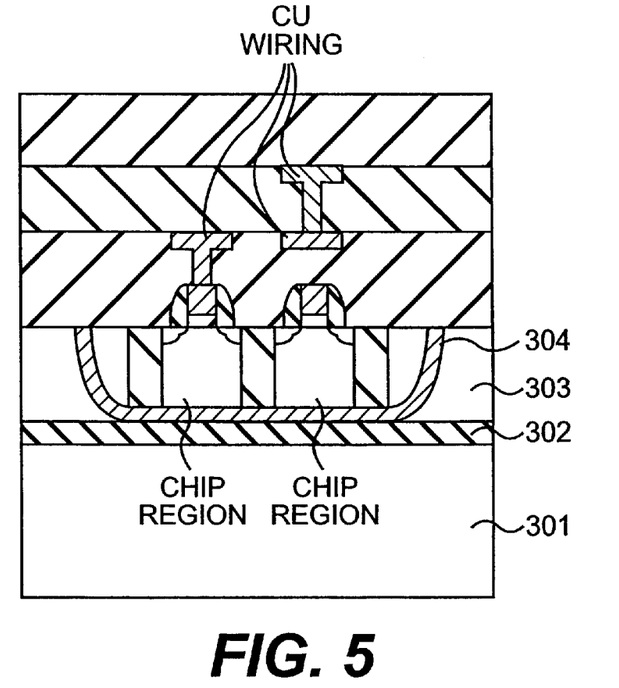
FIG. 5 is a sectional view showing still another modification of the second embodiment.
Figure 6:
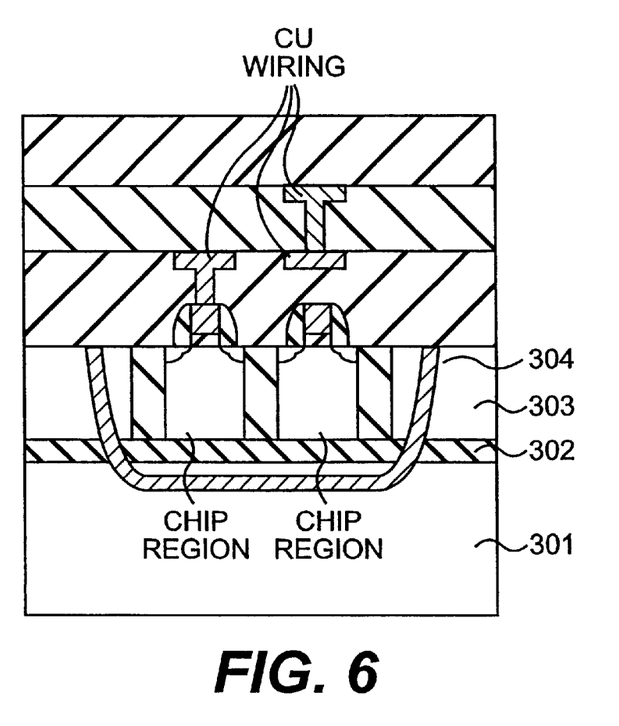
FIG. 6 is a sectional view showing further another modification of the second embodiment.
Figure 7A:
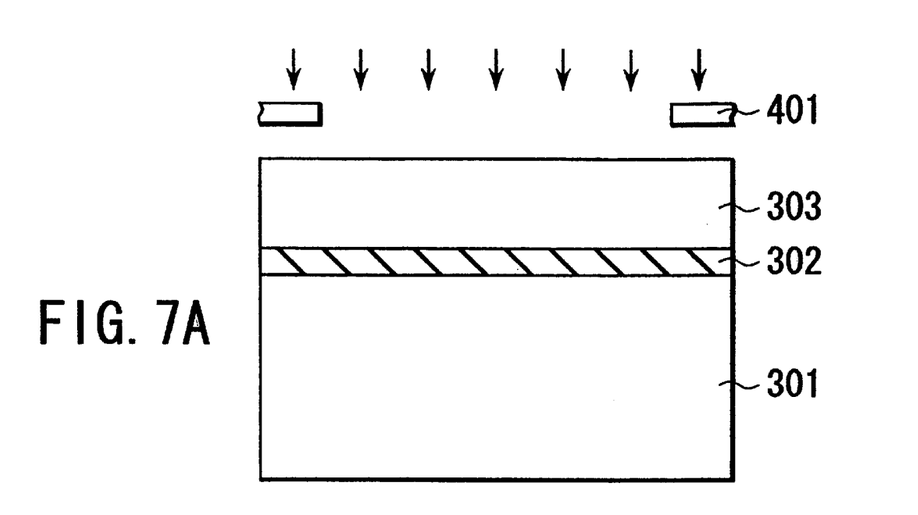
FIGS. 7A and 7B are sectional views showing a step of forming an SOI substrate shown in FIG. 5.
Figure 7B:
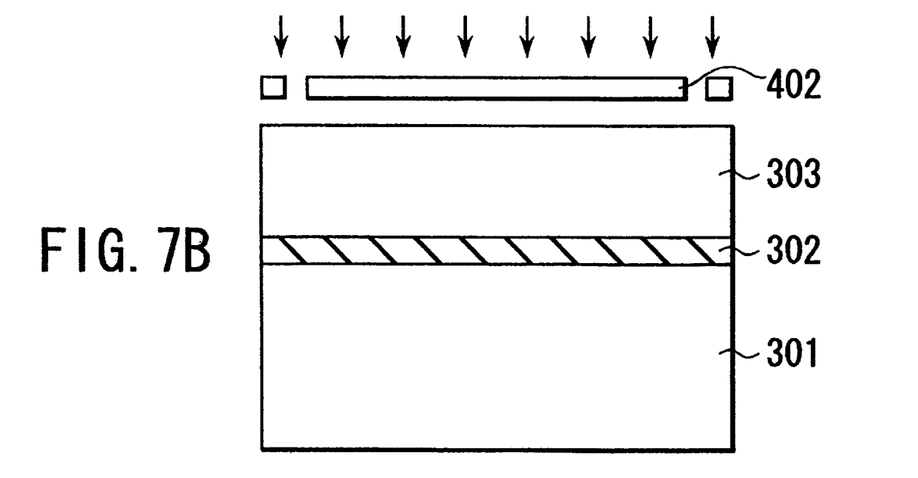

Further, the diffusion barrier layer 304 may be formed to cover the side surface of the element region, as shown in FIG. 5 or 6. By forming the diffusion barrier layer 304 in this manner, the metal diffusion contamination from the side surface of the wafer can be prevented. The diffusion barrier layer 304 can be easily formed on the side surface of the element region by performing the ion implantation twice and the annealing with use of masks each having an opening, for example, stencil masks 401 and 402 as shown in FIGS. 7A and 7B. By adjusting the accelerating energy, the diffusion barrier layer 304 as shown in FIG. 5 or 6 can be attained.

The accelerating energy used for the ion implantation with use of a stencil mask 402 is set smaller than that for the ion implantation with use of a stencil mask 401.

The bawl-like diffusion barrier layer 304 can be obtained by performing the ion implantation once with use of a stencil mask 401. This is because, the edge of the opening of the stencil mask 401 makes a blind spot for the ions obliquely incident into the surface of the substrate.

The bawl-like diffusion barrier layer 304 can be provided to a region containing a plurality of chip regions formed in the silicon substrate 303, or to each of chip regions formed in the silicon substrate 303. The former structure has an advantage that the structure can be obtained by a simple process. In the latter case, the diffusion of Cu into the chips from the side surfaces of the chip can be prevented even after separating the silicon substrate 303 into a plurality of chips.

Further, in the above-mentioned embodiment, the silicon nitride film is employed as the diffusion barrier layer 304, but a similar effect can be expected from the other insulating film which enables the prevention of the diffusion of Cu, e.g. a silicon carbide film, an aluminum nitride film, an aluminum oxide film, and a boron nitride film. The aluminum nitride film is difficult to be formed by ion implantation, and thus the deposition technique such as CVD is preferable to form it. The insulation films presented above can be also used as the insulating film of the SOI substrate. In this case, the structure of the substrate can be more simplified by forming the insulating film of the SOI substrate and the insulating film as the diffusion barrier layer with the same kind of insulating film. The insulating film of the SOI substrate can be formed with a low-k film having a dielectric constant lower than $SiO_2$.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor region having a semiconductor element; and
   a diffusion barrier layer provided in the semiconductor region and being shaped like a bowl,
   wherein the diffusion barrier layer is proved in a region containing a plurality of chip regions.

2. A semiconductor device comprising:
   a semiconductor region having a semiconductor element; and
   a diffusion barrier layer provided in the semiconductor region and being shaped like a bowl,
   wherein the diffusion barrier layer is provided in each of a plurality of chip regions.

3. A semiconductor device comprising:
   a supporting substrate;
   an insulating film provided on the supporting substrate;
   a semiconductor region provided on the insulating film, the semiconductor region having a semiconductor element formed therein; and
   a diffusion barrier layer a part of which is provided in the semiconductor region, a part of which is provided in the insulating film, a bottom of which is placed in the supporting substrate and being shaped like a bowl,
   wherein the diffusion barrier layer is provide in a region containing a plurality of chip regions.

4. A semiconductor device comprising:
   a supporting substrate;
   a insulating film provided on the supporting substrate;
   a semiconductor region provided on the insulating film, the semiconductor region having a semiconductor element formed therein; and
   a diffusion barrier layer a part of which is provided in the semiconductor region, a part of which is provided in the insulating film, a bottom of which is placed in the supporting substrate and being shaped like a bowl,
   wherein the diffusion barrier layer is provided in each of a plurality of chip regions.

* * * * *

UNITED STATES PATENT AND TRADEMARK OFFICE
CERTIFICATE OF CORRECTION

PATENT NO.   : 6,541,861 B2
DATED        : April 1, 2003
INVENTOR(S)  : Higashi et al.

It is certified that error appears in the above-identified patent and that said Letters Patent is hereby corrected as shown below:

Column 10,
Line 5, change "provide" to -- provided --.
Line 10, change "a insulating" to -- an insulating --.

Signed and Sealed this

First Day of July, 2003

JAMES E. ROGAN
*Director of the United States Patent and Trademark Office*